(12) United States Patent
Kitahara

(10) Patent No.: US 11,696,425 B2
(45) Date of Patent: Jul. 4, 2023

(54) ELECTROMAGNETIC SHIELD MEMBER AND WIRE HARNESS

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventor: Yuta Kitahara, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 168 days.

(21) Appl. No.: 17/438,260

(22) PCT Filed: Jan. 24, 2020

(86) PCT No.: PCT/JP2020/002531
§ 371 (c)(1),
(2) Date: Sep. 10, 2021

(87) PCT Pub. No.: WO2020/183939
PCT Pub. Date: Sep. 17, 2020

(65) Prior Publication Data
US 2022/0192064 A1      Jun. 16, 2022

(30) Foreign Application Priority Data

Mar. 11, 2019   (JP) .................... 2019-043638

(51) Int. Cl.
H02G 3/04     (2006.01)
H05K 9/00     (2006.01)
B60R 16/02    (2006.01)

(52) U.S. Cl.
CPC ....... H05K 9/0018 (2013.01); B60R 16/0215 (2013.01); H02G 3/0418 (2013.01)

(58) Field of Classification Search
None
See application file for complete search history.

(56) References Cited

U.S. PATENT DOCUMENTS 3,749,813 A * 7/1973 Shealy ............... H02G 7/14
                                              174/42
2005/0045357 A1* 3/2005 Ichikawa ............ H02G 3/0431
                                              174/50

(Continued)

FOREIGN PATENT DOCUMENTS

JP   S53-087898 U   7/1978
JP   2005-044607 A  2/2005

OTHER PUBLICATIONS

Apr. 14, 2020 Search Report issued in International Patent Application No. PCT/JP2020/002531.

*Primary Examiner* — Krystal Robinson
(74) *Attorney, Agent, or Firm* — Oliff PLC

(57) ABSTRACT

An electromagnetic shield member including: a case including a groove in which an electric wire is to be housed; a cover configured to be attached to the case and cover the groove; and a pressing mechanism that is housed in the groove and configured to press the electric wire, wherein the pressing mechanism has a wall that covers an outer circumferential surface of the electric wire in conjunction with the groove, and a presser provided on the wall and configured to press the electric wire.

9 Claims, 5 Drawing Sheets

(56) References Cited

U.S. PATENT DOCUMENTS

| | | | |
|---|---|---|---|
| 2005/0087358 A1* | 4/2005 | Santelli | H02G 3/0418 |
| | | | 174/68.1 |
| 2020/0028337 A1* | 1/2020 | Hartman | H02G 3/0456 |
| 2022/0161742 A1* | 5/2022 | Saito | H01B 7/18 |

* cited by examiner

ELECTROMAGNETIC SHIELD MEMBER AND WIRE HARNESS

BACKGROUND

The present disclosure relates to an electromagnetic shield member and a wire harness that includes the electromagnetic shield member and an electric wire.

Conventionally, for example, a wire harness applied to a vehicle such as an electric car is provided with a plurality of electric wires and an electromagnetic shield member that has conductive properties and electromagnetically shields the electric wires by individually covering the electric wires (e.g., see JP 2005-44607M. The electromagnetic shield member disclosed in JP 2005-44607A includes a shielding protector that has groove-shaped housing portions in which electric wires can be individually housed, and a cover that seals off the groove-shaped housing portions. The electric wires are electromagnetically shielded due to the outer circumferential surfaces of the electric wires being covered by the shielding protector and the cover.

SUMMARY

Incidentally, improved heat dissipation is desired for conventional electromagnetic shield members including the electromagnetic shield member disclosed in JP 2005-44607A and wire harnesses provided with such an electromagnetic shield member. In particular, in a wire harness in which an electric wire is connected to a high-voltage electrical device such as an inverter, the current flowing through the electric wire is large, and thus issues caused by heat generated by the electric wire are pronounced.

An exemplary aspect of the disclosure provides an electromagnetic shield member and a wire harness that can increase the heat dissipation of an electric wire.

An electromagnetic shield member according to an exemplary aspect includes: a case including a groove in which an electric wire is to be housed; a cover configured to be attached to the case and cover the groove; and a pressing mechanism that is housed in the groove and configured to press the electric wire, wherein the pressing mechanism has a wall that covers an outer circumferential surface of the electric wire in conjunction with the groove, and a presser provided on the wall and configured to press the electric wire.

With this configuration, a pressing mechanism that has a presser for pressing an electric wire is provided in the groove of the case. The presser is provided on the wall that surrounds the outer circumferential surface of the electric wire in conjunction with the groove of the case, and thus, by housing the electric wire in the electromagnetic shield member, the electric wire is pressed by the presser. Therefore, heat from the electric wire is likely to dissipate from the wall that includes the presser.

In the above electromagnetic shield member, it is preferable that the wall of the pressing mechanism includes a pair of opposing walls that oppose each other in a width direction of the groove, and the presser is provided on at least one of the pair of opposing walls and presses the electric wire toward the other opposing wall.

With this configuration, the presser is provided on at least one of the pair of opposing walls Thus, if there is excess length in the electric wire due to thermal expansion, the electric wire bends in the width direction while being pressed by the presser. Accordingly, excess length in the electric wire is absorbed, and the outer circumferential surface of the electric wire is kept in contact with the presser. Thus, even if there is excess length in the electric wire, heat from the electric wire is likely to dissipate via the opposing wall that includes the presser.

In the above electromagnetic shield member, it is preferable that the presser is provided on both of the opposing walls.

With this configuration, a presser is provided on each opposing wall, and thus the electric wire is pressed from both sides in the width direction. Accordingly, compared to a configuration in which an electric wire is only pressed from one side in the width direction by a presser, the pressers and the electric wire are more likely to be in close contact and the contact area between the pressers and the electric wire is greater. Accordingly, heat from the electric wire is more likely to dissipate via the opposing walls that include the pressers.

In the above electromagnetic shield member, it is preferable that the presser includes a plurality of pressers, the pressers being provided at different positions in an extending direction of the groove.

With this configuration, the pressers are provided at different positions in the extending direction of the groove. Accordingly, the portion of the electric wire pressed to one side in the width direction and the portion of the electric wire pressed to the other side in the width direction are located at different positions in the extending direction. Accordingly, if there is excess length in the electric wire due to thermal expansion, the electric wire curves to one side and the other side in the width direction at different positions in the extending direction. Thus, the excess length of the electric wire can be favorably absorbed while keeping the pressers and the electric wire in close contact with each other.

Also, with this configuration, the pressers press the electric wire from both sides in the width direction at different positions in the extending direction. Thus, the distance that the electric wire is pressed by the pressers in order to absorb a predetermined excess length is shorter than the distance a presser presses an electric wire in a configuration in which the presser is only provided on one side in the width direction. Accordingly, the interval between the pair of opposing walls in the pressing mechanism and the size of the pressing mechanism in the width direction can be reduced.

In the above electromagnetic shield member, it is preferable that the presser is formed by cutting and raising a portion of the wall.

With this configuration, the presser is formed integrated with the wall. Thus, compared to a configuration in which the presser is formed separate from the wall, the heat resistance at the interface between the presser and the wall is reduced. Accordingly, heat from the electric wire is likely to dissipate via the presser.

Also, with this configuration, there is no need to prepare separate pressers, and thus the number of parts of the pressing mechanism can be kept from increasing.

In the above electromagnetic shield member, it is preferable that the pressing mechanism is provided with a spring that biases the presser toward the electric wire.

With this configuration, the presser is biased toward the electric wire by the spring, and thus, in a case where there is excess length in the electric wire due to thermal expansion and the electric wire is curved, the presser favorably comes in contact with the outer circumferential surface of the electric wire by following the curving of the electric wire. Accordingly, heat from the electric wire is likely to dissipate via the presser.

In the above electromagnetic shield member, it is preferable that a leading end of the presser is provided with a restrictor that restricts floating of the electric wire from an inner surface of the groove.

With this configuration, the restrictor provided on the leading end of the presser keeps the electric wire from floating from the inner surface of the groove of the case. Thus, a state in which the electric wire and the inner surface of the groove are in contact with each other can be easily maintained. Accordingly, heat from the electric wire is likely to dissipate via the presser and the groove of the case.

In the above electromagnetic shield member, it is preferable that the restrictor is provided separate from the presser.

In a configuration where the presser is formed by cutting and raising a portion of the opposing wall of the pressing mechanism and the restrictor is formed integrated with the presser, the presser and the restrictor need to be cut and raised from the same opposing wall, and thus the degree of freedom of the shape of the restrictors may be diminished.

In this regard, with this configuration, the restrictor and the presser are provided separately, and thus the aforementioned issue can be kept from occurring.

A wire harness according to an exemplary aspect includes: an electric wire; and any one of the above electromagnetic shield members, wherein the electric wire is preferably pressed by the presser of the pressing mechanism.

With this configuration, operations and effects according to those of any one of the above-described electromagnetic shield members can be realized.

With the present disclosure, the heat dissipation of an electric wire can be improved.

BRIEF DESCRIPTION OF THE DRAWINGS

FIG. 6 shows a pressing mechanism according to a first modification, where

DETAILED DESCRIPTION OF EMBODIMENTS

An embodiment of an electromagnetic shield member and a wire harness will be described below with reference to FIGS. 1 to 5. Note that, in the accompanying drawings, some of the components may be exaggerated or simplified for the sake of convenience of description. The dimensional ratios of the components may also be different from the actual dimensional ratios thereof.

The wire harness according to the present embodiment is routed along a path including under the floor of a vehicle such as a hybrid car or electric vehicle, for example, and electrically connects devices to each other.

Figure 1:
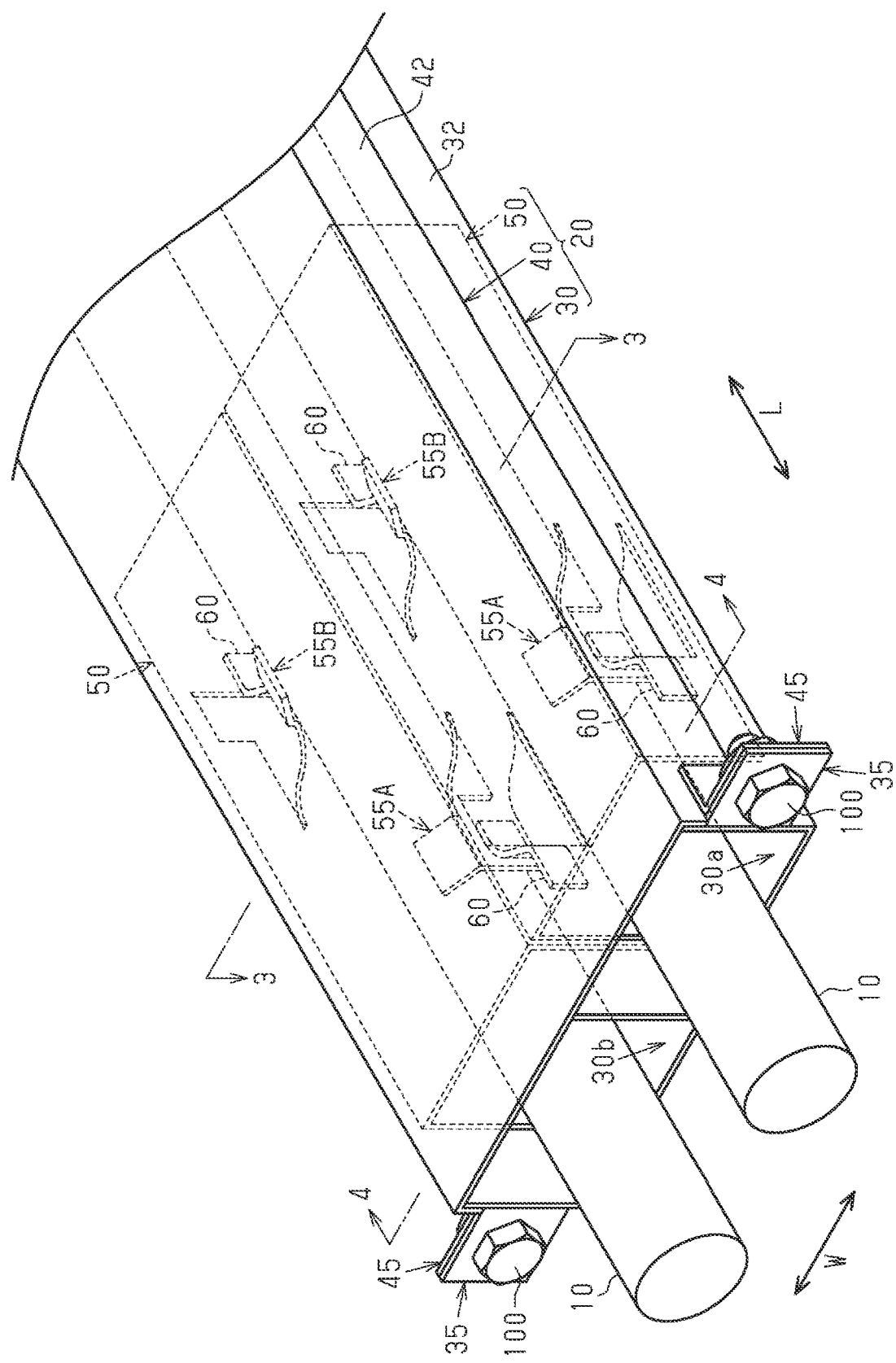
FIG. 1 is a perspective view showing a wire harness in an embodiment of an electromagnetic shield member and a wire harness.
Figure 2:
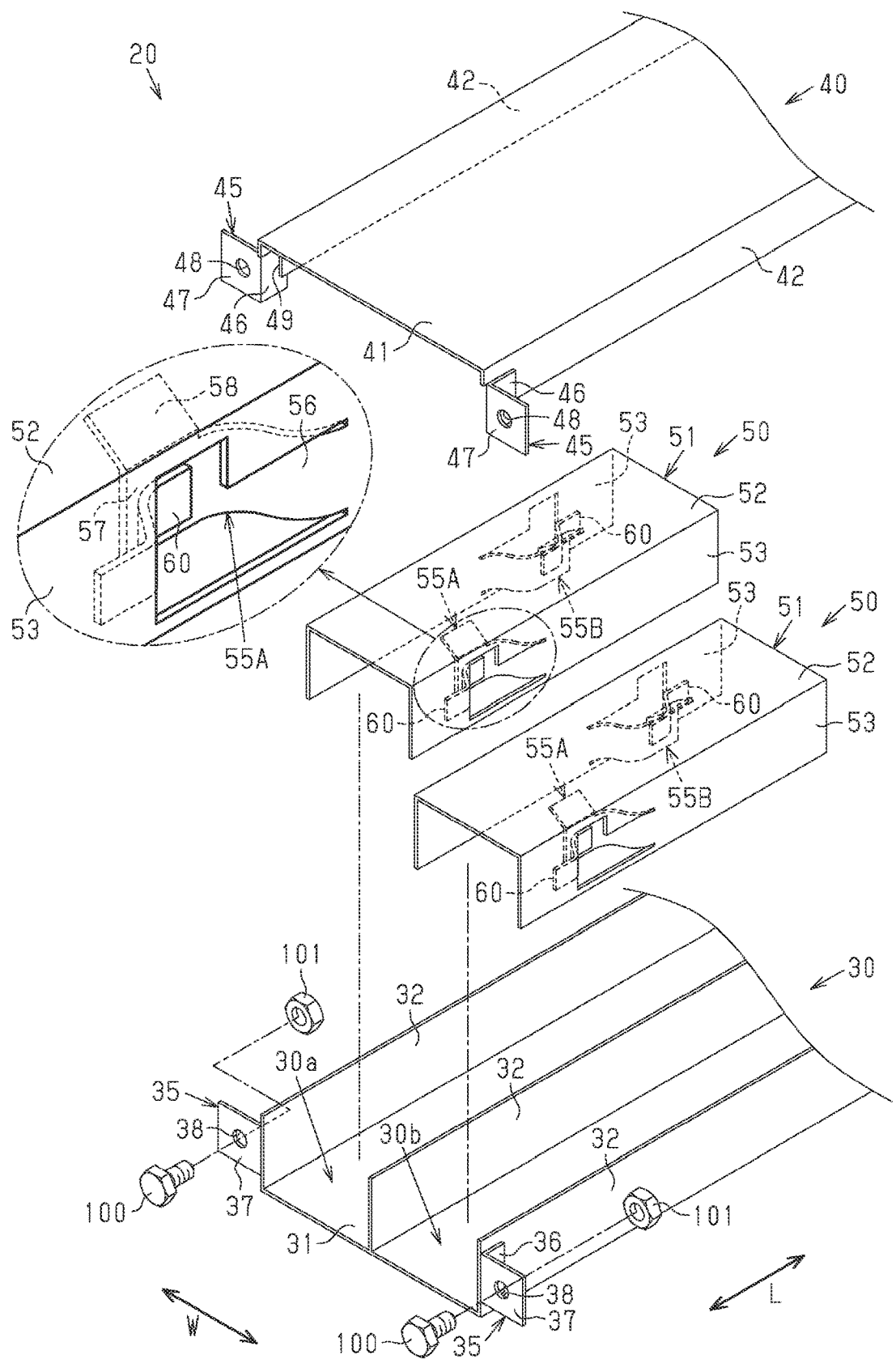
FIG. 2 is an exploded perspective view showing the electromagnetic shield member of the embodiment.

As shown in FIGS. 1 and 2, the wire harness is provided with two electric wires 10 arranged in parallel, and a conductive electromagnetic shield member 20 that covers the electric wires 10.

Each electric wire 10 includes a core wire and an insulating coating that covers the outer circumferential surface of the core wire. The two end portions of each electric wire 10 are connected to the aforementioned devices.

The electromagnetic shield member 20 is provided with a case 30 that has groove portions 30a and 30b (grooves) into which the electric wires 10 are individually housed, a cover 40 that is attached to the case 30 and covers the groove portions 30a and 30b, and a plurality of pressing mechanisms 50 that are housed in the groove portions 30a and 30b and press the electric wires 10. In the present embodiment, one pressing mechanism 50 is provided in each of the groove portions 30a and 30b of the case 30. The case 30, the cover 40, and the pressing mechanisms 50 are each made of a metal material such as an aluminum alloy.

Note that, in the following, the direction in which the groove portions 30a and 30b extend is defined as an extending direction L, and the direction that is orthogonal to the extending direction L and is the direction in which the groove portions 30a and 30b are arranged in parallel is defined as a width direction W.

Case 30

As shown in FIG. 2, the case 30 has a bottom wall 31 that extends along the extending direction L and three side walls 32 respectively protruding from the two ends in the width direction W of the bottom wall 31 and the center portion in the width direction W of the bottom wall 31. The side walls 32 each extend along the entirety of the bottom wall 31 in the extending direction L.

The groove portions 30a and 30b are each formed by the bottom wall 31 and a pair of side walls 32 that are adjacent in the width direction W. In the present embodiment, the groove portion 30a and the groove portion 30b share the side wall 32 located at the center portion in the width direction W.

The case 30 has a pair of L-shaped brackets 35 respectively joined to the outer faces of the side walls 32 at the two ends of the case 30 in the width direction W. Each bracket 35 has a joining portion 36 joined to one end in the extending direction L of the corresponding side wall 32, and an attachment portion 37 that is bent from the one end in the extending direction L of the joining portion 36. Each attachment portion 37 is provided with an attachment hole 38 that extends therethrough in the extending direction L. Note that each attachment portion 37 is flush with the one end face in the extending direction L of the corresponding side wall 32.

Cover 40

As shown in FIG. 2, the cover 40 has an opposing wall 41 that extends along the extending direction L and opposes the bottom wall 31 of the case 30, and two side walls 42 that protrude from the two ends in the width direction W of the opposing wall 41. The side walls 42 each extend along the entirety of the opposing wall 41 in the extending direction L.

Figure 4:
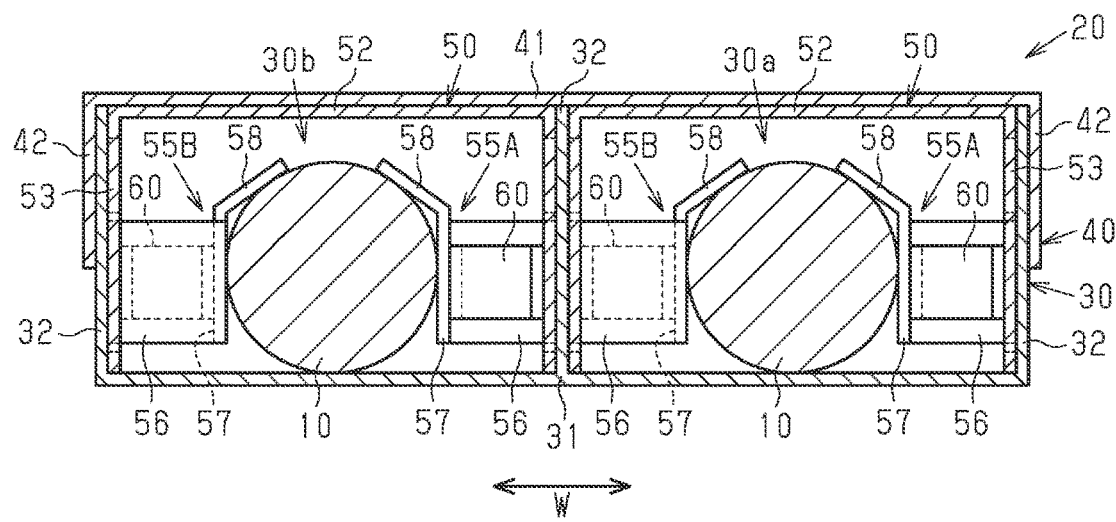
FIG. 4 is a cross-sectional view taken along line 4-4 shown in FIG. 1.

As shown in FIGS. 1 and 4, the side walls 32 at the two ends of the case 30 in the width direction W are covered from the outer side in the width direction W by the side walls 42 of the cover 40.

As shown in FIG. 2, the cover 40 has a pair of L-shaped brackets 45 respectively joined to the outer faces of the side walls 42 at the two ends of the cover 40 in the width direction W. Each bracket 45 has a joining portion 46 joined to one end in the extending direction L of the corresponding side wall 42, and an attachment portion 47 that is bent from the one end in the extending direction L of the joining portion 46. Each attachment portion 47 is provided with an attachment hole 48 that extends therethrough in the extending direction L.

Here, escape portions 49 for preventing interference with the joining portions 36 of the bracket 35 of the case 30 when the cover 40 is attached to the case 30, are formed by cutting out portions at the one end in the extending direction L of the side walls 42. The joining portion 46 of each bracket 45 covers the corresponding escape portion 49 from the outer side in the width direction W.

By overlapping the brackets 35 of the case 30 and the brackets 45 of the cover 40 in the extending direction L, and screwing nuts 101 onto bolts 100 passed through the attachment holes 38 of the brackets 35 and the attachment holes 48 of the brackets 45, the cover 40 is fixed to the case 30.

Pressing Mechanism 50

As shown in FIG. 2, each pressing mechanism 50 has a wall portion 51 (wall) that surrounds the outer circumferential surface of the corresponding electric wire 10 in conjunction with the bottom wall 31 of the case 30. The wall portion 51 has a top wall portion 52 that extends in the extending direction L and opposes the bottom wall 31 of the case 30, and a pair of opposing wall portions 53 that respectively protrude from the two ends of the top wall portion 52 in the width direction W and oppose each other in the width direction W. The opposing wall portions 53 extend over the entirety of the top wall portion 52 in the extending direction L.

Figure 3:
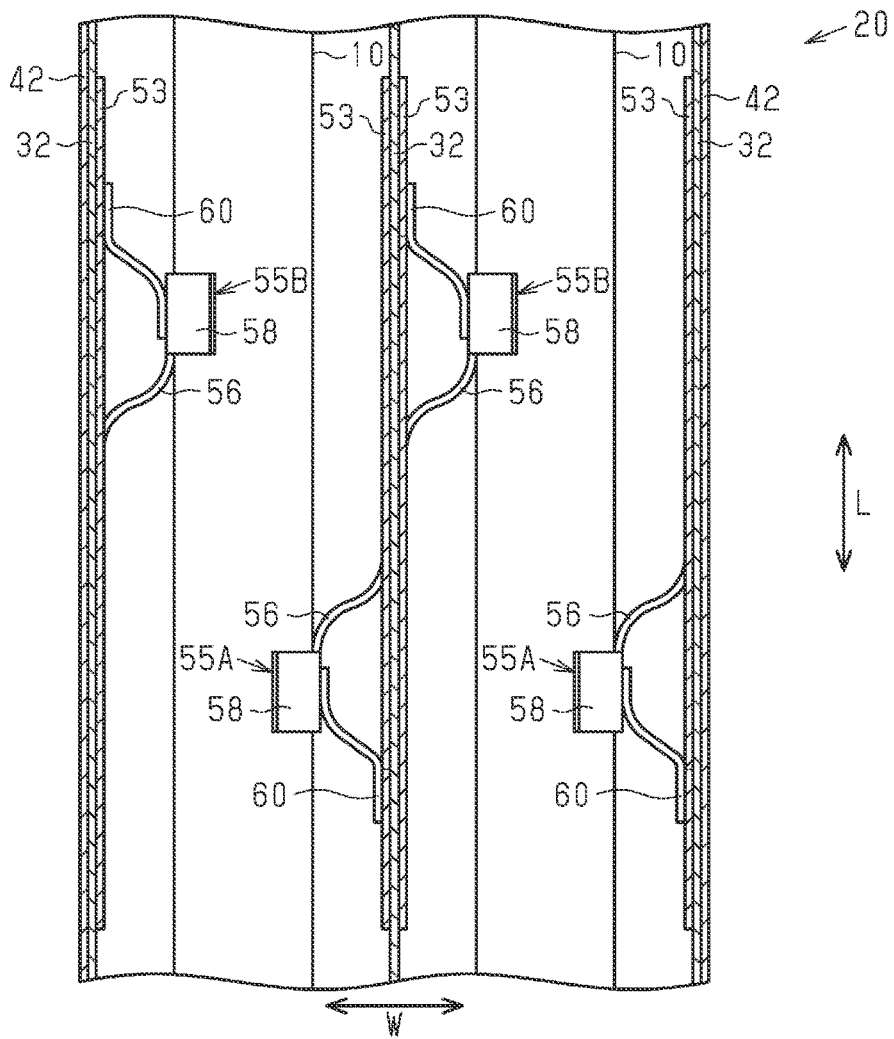
FIG. 3 is a cross-sectional view taken along line 3-3 shown in FIG. 1.

As shown in FIGS. 2 and 3, a portion of one opposing wall portion 53 (on the right side in FIG. 3) in the width direction W and a portion of the other opposing wall portion 53 (on the left side in FIG. 3) in the width direction W are provided with pressing portions 55A and 55B (pressers), which are formed by being cut and raised inward in the width direction W and press the electric wires 10 inward in the width direction W. The pressing portion 55A is provided on one side (lower side in FIG. 3) in the extending direction L of the aforementioned opposing wall portion 53 on the one side. Also, the pressing portion 55B is provided on the other side (upper side in FIG. 3) in the extending direction L of the aforementioned opposing wall portion 53 on the other side. Accordingly, the pressing portions 55A and 55B are provided at different positions in the extending direction L.

The pressing portion 55A is cut and raised from the corresponding opposing wall portion 53 such that the base end is on the other side in the extending direction L and the leading end is on the one side in the extending direction L. Also, the pressing portion 55B is cut and raised from the corresponding opposing wall portion 53 such that the base end is on the one side in the extending direction L and the leading end is on the other side in the extending direction L. Accordingly, the pressing portions 55A and 55B extend in different directions in the extending direction L.

The pressing portions 55A and 55B each have a curved portion 56 that curves bulging inward in the width direction W from the corresponding opposing wall portion 53, and an extending portion 57 that extends along the extending direction L from the leading end of the curved portion 56. Each electric wire 10 is pressed inward in the width direction W by the extending portions 57 of the pressing portions 55A and 55B.

As shown in FIGS. 2 to 4, the portion on the top wall portion 52 side of the leading end of each of the extending portions 57 is provided with a restricting portion 58 (restrictor) that restricts floating of the corresponding wire 10 from the bottom wall 31 of the case 30. The restricting portions 58 respectively extend from the aforementioned portions of the extending portions 57 so as to abut against the outer circumferential surface of the corresponding electric wire 10. Thus, each electric wire 10 is pressed inward in the width direction W by the corresponding extending portions 57 of the pressing portions 55A and 55B, and pressed inward in the width direction W and toward the bottom wall 31 by the corresponding restricting portions 58. Note that, in the present embodiment, the curved portion 56, the extending portion 57, and the restricting portion 58 are formed integrated with each other.

Each opposing wall portion 53 is provided with a leaf spring 60 serving as a biasing member that biases the pressing portion 55A or 55B toward the electric wire 10. Each leaf spring 60 has a rectangular shape extending along the extending direction L. The base end of each leaf spring 60 is joined to the corresponding opposing wall portion 53 through welding or the like, and the leading end thereof abuts against the extending portion 57 of the pressing portion 55A or 55B from the outer side in the width direction W. The leaf springs 60 are formed by bending a metal material such as stainless steel, for example.

Note that, in the present embodiment, the pressing mechanisms 50 respectively housed in the groove portions 30a and 30b are provided at the same position in the extending direction L.

Operations of the present embodiment will be described below.

As shown in FIG. 3, the electric wires 10 housed in the electromagnetic shield member 20 are pressed inward in the width direction W by the pressing portions 55A and 55B of the pressing mechanisms 50 (Operation 1).

Figure 5:
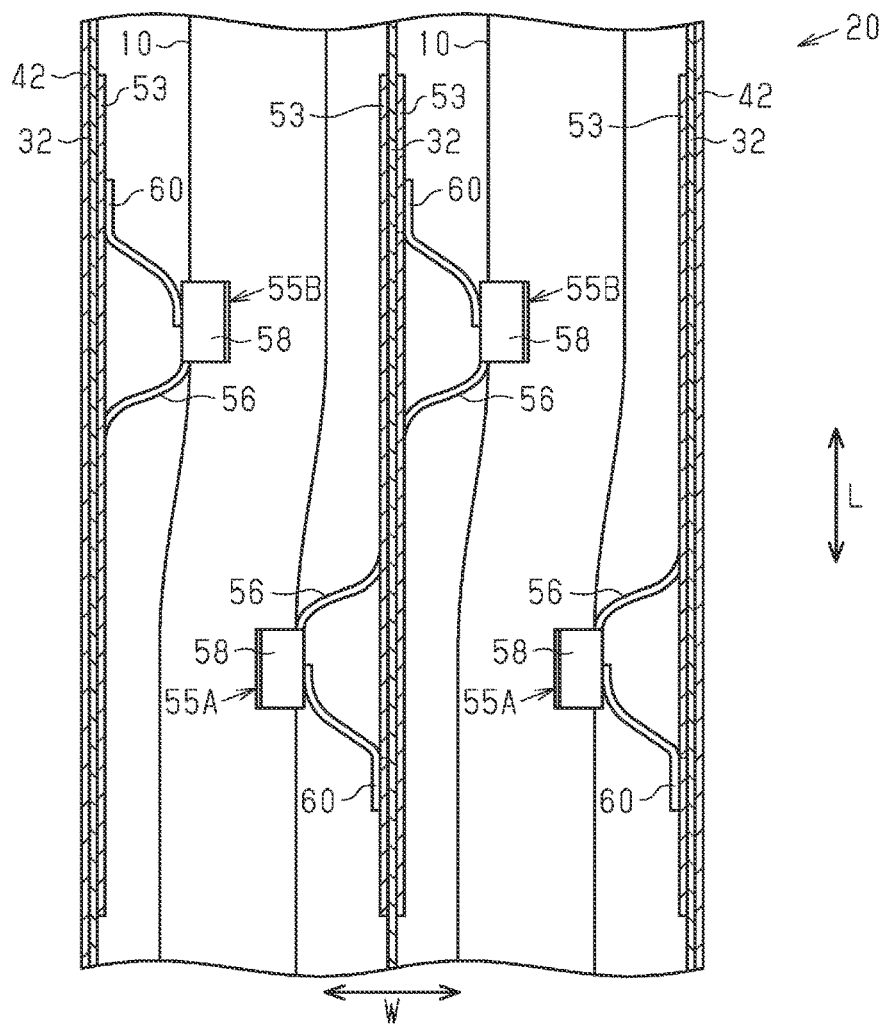
FIG. 5 is a diagram corresponding to FIG. 3, and is a cross-sectional view showing the wire harness in a state where the electric wires have excess length.

Here, as shown in FIG. 5, if there is excess length in the electric wires 10 due to thermal expansion, the electric wires 10 curve in the width direction W while being pressed by the pressing portions 55A and 55B. Accordingly, the excess length of the electric wires 10 can be absorbed, and the state in which the pressing portions 55A and 55B are in contact with the outer circumferential surfaces of the electric wires 10 is maintained (Operation 2).

Also, the pressing portions 55A and 55B are provided at different positions in the extending direction L, and thus for each electric wire 10, the portion pressed to one side in the width direction W and the portion pressed to the other side in the width direction W are located at different positions in the extending direction L. Accordingly, if there is excess length in the electric wires 10 due to thermal expansion, the electric wires 10 curve to one side and the other side in the width direction W at different positions in the extending direction L (Operation 3).

Effects of the present embodiment will be described below.

(1) An electromagnetic shield member 20 includes a case 30 that has groove portions 30a and 30b into which two electric wires 10 are to be housed respectively, a cover 40 that is attached to the case 30 and covers the groove portions 30a and 30b, and a plurality of pressing mechanisms 50 that are respectively housed in the groove portions 30a and 30b and press the electric wires 10. Each pressing mechanism 50 has a pair of opposing wall portions 53 that oppose each other in the width direction W, a wall portion 51 that surrounds the outer circumferential surface of the electric wire 10 in conjunction with a bottom wall 31 of the case 30, and pressing portions 55A and 55B that are respectively provided on the pair of opposing wall portions 53 of the wall portion 51 and that press the corresponding electric wire 10 inward in the width direction W.

With such a configuration, the aforementioned Operation 1 is realized, and thus heat from the electric wires 10 is more likely to dissipate via the opposing wall portions 53 that include the pressing portions 55A and 55B.

Also, the aforementioned Operation 2 is realized, and thus even if there is excess length in the electric wires 10, heat from the electric wires 10 is more likely to dissipate via the opposing wall portions 53 that include the pressing portions 55A and 55B.

(2) The pressing portions 55A and 55B are provided at different positions in the extending direction L.

With this configuration, the aforementioned Operation 3 is realized, and thus excess length in the electric wires 10 can favorably be absorbed while keeping the pressing portions 55A and 55B and the electric wires 10 in close contact with each other.

Also, with the above configuration, the pressing portions 55A and 55B press the electric wires 10 from both sides in the width direction W at different positions in the extending direction L. Thus, the distance that the electric wires 10 are pressed by the pressing portions 55A and 55B in order to absorb a predetermined excess length is shorter than the distance that a pressing portion presses an electric wire 10 in a configuration in which the pressing portion is only provided on one side in the width direction W. Accordingly, the interval between the pair of opposing wall portions 53 in the pressing mechanism 50 and the size of the pressing mechanism 50 in the width direction W can be reduced.

(3) The pressing portions 55A and 55B are formed by cutting and raising a portion of each opposing wall portion 53.

With this configuration, the pressing portions 55A and 55B are formed integrated with the corresponding opposing wall portion 53. Thus, compared to a configuration in which the pressing portions 55A and 55B are formed separate from the opposing wall portions 53, thermal resistance at interfaces between the pressing portions 55A and 55B and the opposing wall portions 53 is reduced. Accordingly, heat from the electric wires 10 is likely to dissipate via the pressing portions 55A and 55B.

Also, with the above configuration, there is no need to prepare separate pressing portions, and thus the number of parts of the pressing mechanism 50 can be kept from increasing.

(4) Each pressing mechanism 50 includes leaf springs 60 acting as biasing members that bias the pressing portions 55A and 55B toward the corresponding electric wire 10.

With this configuration, the pressing portions 55A and 55B are biased toward an electric wire 10 by the leaf springs 60, and thus, in a case where there is excess length in the electric wires 10 due to thermal expansion and the electric wires 10 are curved, the pressing portions 55A and 55B favorably come in contact with the outer circumferential surface of the corresponding electric wire 10 by following the curving of the electric wire 10. Accordingly, heat from the electric wires 10 is likely to dissipate via the pressing portions 55A and 55B.

(5) Extending portions 57 of the pressing portions 55A and 55B are each provided with a restricting portion 58 that restricts floating of an electric wire 10 from the bottom wall 31 of the case 30.

With this configuration, the restricting portions 58 provided on the extending portions 57 of the pressing portions 55A and 55B keep the electric wires 10 from floating from the bottom wall 31 of the case 30. Thus, a state in which the electric wires 10 and the bottom wall 31 of the case 30 are in contact with each other can be easily maintained. Accordingly, heat from the electric wires 10 is likely to dissipate via the pressing portions 55A and 55B and the bottom wall 31 of the case 30.

(6) A wire harness that includes two electric wires 10 that are pressed by pressing portions 55A and 55B of two pressing mechanisms 50, and an electromagnetic shield member 20.

With this configuration, effects according to the above-described Effects (1) to (5) can be realized.

The following changes can be made to the present embodiment. The present embodiment and the following variations can be combined and implemented as long as there is no technical contradiction.

Note that, configurations in the following first, second, and third modifications respectively shown in FIGS. 6, 7, and 8 that are the same as those of the above-described embodiment are given the same reference numerals, and corresponding configurations are given reference numerals to which 100, 200, and 300 have been respectively added to omit redundant description.

Figures 6A, 6B:
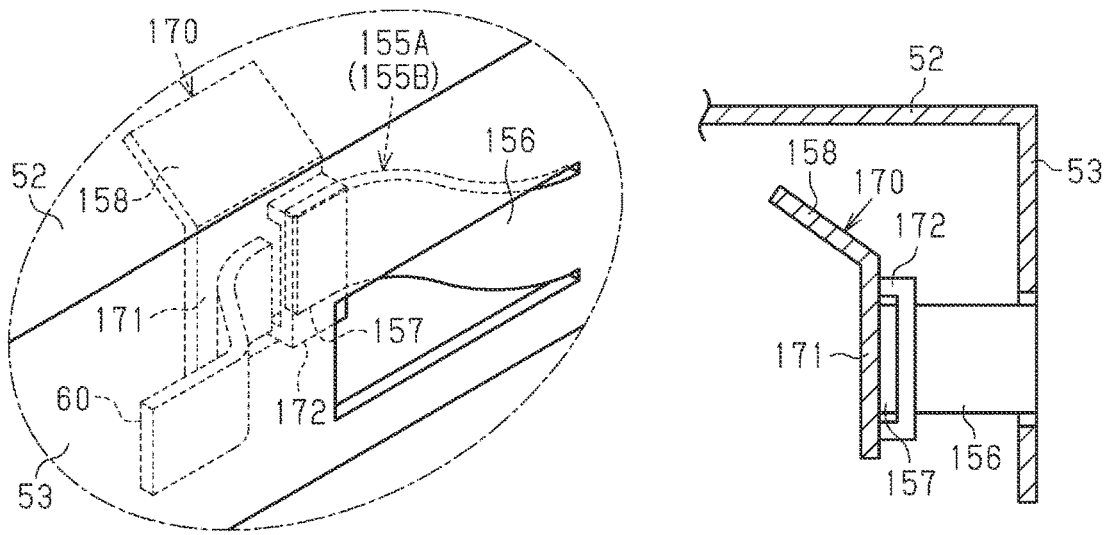
FIG. 6(a) is a perspective view showing a state where an abutting member is attached to a pressing portion.
FIG. 6(b) is a vertical cross-sectional view centered about the pressing portion and the abutting member.

The pressing portions 55A and 55B are not limited to being formed by a curved portion 56, an extending portion 57, and a restricting portion 58 that are formed as a single piece. As shown in FIGS. 6(a) and 6(b), pressing portions 155A and 155B may each formed by a curved portion 156 and an extending portion 157, and an abutting member 170 that has a restricting portion 158 may be attached to each of the pressing portions 155A and 155B so as to abut against an electric wire 10. Each abutting member 170 has a plate-shaped attachment portion 171 that extends in the extending direction L and a restricting portion 158 provided at a portion on the top wall portion 52 side of the attachment portion 171. A portion on one side in the extending direction L of the outer face in the width direction W of the attachment portion 171 is provided with a cavity portion 172 into which the leading end of the extending portion 157 is inserted and fixed. In this case, the leaf spring 60 may be provided so as to press the portion of the outer surface in the width direction W of the attachment portion 171 not provided with the cavity portion 172.

Note that, in a configuration in which a pressing portion is formed by cutting and raising a portion of the opposing wall portions of a pressing mechanism and a restricting portion is formed integrated with the pressing portion, the pressing portion and the restricting portion need to be cut and raised from the same opposing wall portion, and thus the degree of freedom of the shape of the restricting portion may be diminished.

In this regard, with the configuration of the first modification, abutting members 170 each including a restricting portion 158 are provided separately from the pressing portions 155A and 155B, and thus the aforementioned issue can be kept from occurring.

In the above first modification, the abutting members 170 may be made of a metal material or a resin material. Also, the abutting members 170 and the extending portions 157 may be fixed to each other through welding or adhesion via an adhesive.

Figure 7:
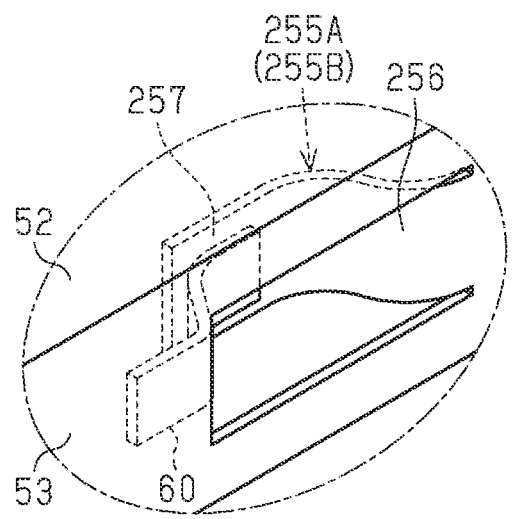
FIG. 7 is a perspective view showing a pressing mechanism according to a second modification.

As shown in FIG. 7, pressing portions 255A and 255B each constituted by a curved portion 256 and an extending portion 257 and not including a restricting portion 58 can also be employed.

Figure 8:
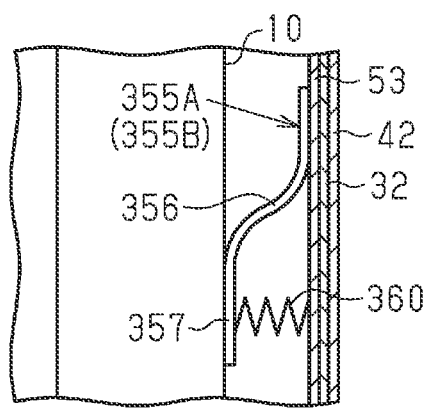
FIG. 8 is a cross-sectional view showing a pressing-mechanism according to a third modification.

As shown in FIG. 8, pressing portions 355A and 355B that are separate from the opposing wall portions 53 can also be employed. In this case, the pressing portions 355A and 355B may be fixed to an opposing wall portion 53 through welding or the like.

Also, in such a configuration, instead of the leaf springs 60, coil springs 360 that bias extending portions 357 of the pressing portions 355A and 355B inward in the width direction W can also be provided.

The pressing portions 55A and 55B may be provided at the same position in the extending direction L.

The pressing mechanisms 50 may each include a plurality of the pressing portions 55A and 55B.

Each pressing mechanism may include only the pressing portion 55A, or may include only the pressing portion 55B.

The pressing portions may be formed by cutting and raising a portion of the top wall portion 52 of the wall portion 51, and may press an electric wire 10 toward the bottom wall 31 of the case 30. In this case as well, the above Operation 1 is realized, and thus heat from the electric wires 10 is likely to dissipate via the top wall portion 52 that includes the aforementioned pressing portions.

The electromagnetic shield member 20 is not limited to being made of an aluminum alloy. As another example, the electromagnetic shield member 20 may be made of stainless steel or the like.

The electromagnetic shield member 20 may include a plurality of pressing mechanisms 50 provided spaced apart from each other in the extending direction L.

The present disclosure can also be applied to a wire harness that has one electric wire 10 or three or more electric wires 10.

The installation orientation of the wire harness is not limited to the orientation in the above embodiments, and can be changed as necessary.

The cross-sectional shape of a plane of the electric wires 10 orthogonal to the extending direction L may be any cross-sectional shape such as a semi-circle or a polygonal shape.

The present disclosure encompasses the following implementation examples. The reference numerals of some constituent elements of the illustrative embodiment are provided below not for limitation but for assistance in understanding.

[Supplementary Note 1]

One or more implementation examples of this disclosure are directed to an electromagnetic shield member (20) configured to electromagnetically shield an electric wire (10), the electromagnetic shield member (20) can include:

a housing chamber (30a) that has a first length and is configured to house a predetermined length portion of the electric wire (10), and includes a lower surface (31) configured to support the predetermined length portion of the electric wire (10) from below, and parallel first and second side faces (53) that laterally cover or support the predetermined length portion of the electric wire (10); and a first elastic pressing portion (55A) that is disposed at a first length-direction position of the housing chamber (30a) in the first side face (53) of the housing chamber (30a), and elastically presses the electric wire (10) toward the second side face (53) along the lower surface (31).

[Supplementary Note 2]

In one or more implementation examples of this disclosure, the electromagnetic shield member (20) can further include a second elastic pressing portion (55B) that is disposed at a second length-direction position of the housing chamber (30a) in the second side face (53) of the housing chamber (30a), and that elastically presses the electric wire (10) toward the first side face (53) along the lower surface (31).

[Supplementary Note 3]

In one or more implementation examples of this disclosure, the first elastic pressing portion (55A) and the second elastic pressing portion (55B) can be configured to bend the electric wire (10) along the lower surface (31) such that the entirety of the predetermined length portion of the electric wire (10) is in contact with the lower surface (31).

[Supplementary Note 4]

In one or more implementation examples of this disclosure, the first elastic pressing portion (55A) and the second elastic pressing portion (55B) can be configured to bend the electric wire (10) in an S shape or the like along the lower surface (31) such that the entirety of the predetermined length portion of the electric wire (10) is in contact with the lower surface (31) regardless of changes in the length of the electric wire (10) caused by temperature changes in the electric wire (10).

[Supplementary Note 5]

In one or more implementation examples of this disclosure, the lower surface (31) is in contact with the entirety of the predetermined length portion of the electric wire (10), and portions of the first and second side faces (53) other than the first elastic pressing portion (55A) and the second elastic pressing portion (55B) are not in contact with the electric wire (10) between the first length direction position and the second length direction position.

It will be apparent to those skilled in the art that the present disclosure may be embodied in other specific forms without departing from the technical concept of the present disclosure. Some of the components described in the embodiment (or one or more aspects thereof) may be omitted, or some of the components may be combined, for example. The scope of the present disclosure is intended to be determined with reference to the appended claims, along with the full scope of equivalents to which such claims are entitled.

The invention claimed is:

1. An electromagnetic shield member comprising:
    a case including a groove in which an electric wire is to be housed;
    a cover configured to be attached to the case and cover the groove; and
    a pressing mechanism that is housed in the groove and configured to press the electric wire,
    wherein the pressing mechanism has a wall that covers an outer circumferential surface of the electric wire in conjunction with the groove, and a presser provided on the wall and configured to press the electric wire.

2. The electromagnetic shield member according to claim 1,
    wherein the wall of the pressing mechanism includes a pair of opposing walls that oppose each other in a width direction of the groove, and
    the presser is provided on at least one of the pair of opposing walls and presses the electric wire toward the other opposing wall.

3. The electromagnetic shield member according to claim 2, wherein the presser is provided on both of the opposing walls.

4. The electromagnetic shield member according to claim 3, wherein the presser includes a plurality of pressers, the pressers being provided at different positions in an extending direction of the groove.

5. The electromagnetic shield member according to claim 2, wherein a leading end of the presser is provided with a restrictor that restricts floating of the electric wire from an inner surface of the groove.

6. The electromagnetic shield member according to claim 5, wherein the restrictor is provided separate from the presser.

7. The electromagnetic shield member according to claim 1, wherein the presser is formed by cutting and raising a portion of the wall.

8. The electromagnetic shield member according to claim 1, wherein the pressing mechanism is provided with a spring that biases the presser toward the electric wire.

9. A wire harness comprising:
the electric wire; and
the electromagnetic shield member according to claim 1,
wherein the electric wire is pressed by the presser of the pressing mechanism.

* * * * *